US010249988B2

(12) United States Patent
Craton

(10) Patent No.: US 10,249,988 B2
(45) Date of Patent: Apr. 2, 2019

(54) PADDLE CARD HAVING SHORTENED SIGNAL CONTACT PADS

(71) Applicant: FCI USA LLC, Etters, PA (US)

(72) Inventor: Michael T. Craton, Harrisburg, PA (US)

(73) Assignee: FCI USA LLC, Etters, PA (US)

( * ) Notice: Subject to any disclaimer, the term of this patent is extended or adjusted under 35 U.S.C. 154(b) by 0 days.

(21) Appl. No.: 15/543,131

(22) PCT Filed: Jan. 12, 2016

(86) PCT No.: PCT/US2016/012937
§ 371 (c)(1),
(2) Date: Jul. 12, 2017

(87) PCT Pub. No.: WO2016/115063
PCT Pub. Date: Jul. 21, 2016

(65) Prior Publication Data

US 2018/0006406 A1 Jan. 4, 2018

Related U.S. Application Data

(60) Provisional application No. 62/102,564, filed on Jan. 12, 2015.

(51) Int. Cl.
*H01R 12/00* (2006.01)
*H01R 13/6474* (2011.01)
(Continued)

(52) U.S. Cl.
CPC ......... *H01R 13/6474* (2013.01); *H01R 12/72* (2013.01); *H01R 13/6471* (2013.01);
(Continued)

(58) Field of Classification Search
CPC ....................... H01R 13/6474; H01R 13/6471; H01R 12/72; H01R 43/26; H01R 24/66; H01R 24/60
See application file for complete search history.

(56) References Cited

U.S. PATENT DOCUMENTS 6,142,802 A 11/2000 Berg et al.
8,292,669 B2 * 10/2012 Wang .................. H01R 13/514 439/607.2
(Continued)

FOREIGN PATENT DOCUMENTS

CN 102160245 A 8/2011
CN 102377053 A 3/2012
(Continued)

OTHER PUBLICATIONS

International Search Report and Written Opinion for International Application No. PCT/US2016/012937 dated Apr. 25, 2016.
(Continued)

*Primary Examiner* — Xuong Chung Trans
(74) *Attorney, Agent, or Firm* — Wolf, Greenfield & Sacks, P.C.

(57) ABSTRACT

A substrate configured to be mated with an electrical connector having improved performance data is achieved by reducing the length of the electrical signal contact pads of the substrate with respect to the length of electrical signal contact pads of conventional substrates that are configured to be mated with the electrical connector.

24 Claims, 8 Drawing Sheets

(51) Int. Cl.

| | |
|---|---|
| ***H01R 12/72*** | (2011.01) |
| ***H01R 13/6587*** | (2011.01) |
| ***H01R 13/6471*** | (2011.01) |
| ***H01R 43/26*** | (2006.01) |
| *H01R 24/60* | (2011.01) |
| *H01R 107/00* | (2006.01) |

(52) U.S. Cl.

CPC ......... *H01R 13/6587* (2013.01); *H01R 43/26* (2013.01); *H01R 24/60* (2013.01); *H01R 2107/00* (2013.01)

(56) References Cited

U.S. PATENT DOCUMENTS

| | | | | |
|---|---|---|---|---|
| 8,597,056 | B2 * | 12/2013 | Blanchfield | H01R 12/721 439/630 |
| 9,277,649 | B2 * | 3/2016 | Ellison | H01R 12/523 |
| 9,306,334 | B2 * | 4/2016 | Zhu | H05K 1/0219 |
| 9,680,266 | B2 * | 6/2017 | Tomada | H01R 24/66 |
| 2006/0042821 | A1 | 3/2006 | Pax | |
| 2007/0232091 | A1 | 10/2007 | Hong | |
| 2011/0100694 | A1 | 5/2011 | Regnier et al. | |
| 2012/0040563 | A1 | 2/2012 | Wang et al. | |
| 2012/0156938 | A1 * | 6/2012 | Zhang | H01R 13/6461 439/660 |
| 2013/0309906 | A1 | 11/2013 | De Geest | |

FOREIGN PATENT DOCUMENTS

| | | |
|---|---|---|
| CN | 202564699 U | 11/2012 |
| CN | 103250306 A | 8/2013 |

OTHER PUBLICATIONS

International Preliminary Report on Patentability for International Application No. PCT/US2016/012937 dated Jul. 27, 2017.

* cited by examiner

PADDLE CARD HAVING SHORTENED SIGNAL CONTACT PADS

RELATED APPLICATIONS

This application is the U.S. National Stage of and claims priority to and the benefit of International Patent Application Number PCT/US2016/012937, entitled "PADDLE CARD HAVING SHORTENED SIGNAL CONTACT PADS" filed on Jan. 12, 2016, which claims priority under 35 U.S.C. § 119(e) to U.S. Provisional Application Ser. No. 62/102,564, entitled "PADDLE CARD HAVING SHORTENED SIGNAL CONTACT PADS" filed on Jan. 12, 2015, which is herein incorporated by reference in its entirety. The entire contents of these applications are incorporated herein by reference in their entirety.

BACKGROUND

Electrical connectors are configured to transfer electrical signals between complementary electrical components. For instance, an electrical connector can be mounted to a first complementary electrical component, and mated to a second complementary electrical component so as to place the first and second complementary components in electrical communication with each other. The electrical connector can include a dielectric or electrically insulative connector housing and electrical conductors supported by the connector housing. For instance, the electrical conductors can include signal conductors and ground conductors that are disposed between respective ones, pairs, or other quantities, of the signal conductors. The signal conductors can carry data signals, optical signals, or the like between the first and second complementary electrical components. The electrical conductors of some types of electrical connector can further include electrical power conductors that are configured to transmit electrical power between the first and second complementary electrical components.

Certain electrical connectors include at least one substrate, which can be configured as a printed circuit board, that includes the electrical conductors. Such printed circuit boards can also be referred to as paddle cards. For instance, the electrical conductors can be configured as electrical traces that are disposed on an exterior surface of the substrate, disposed in an interior layer of the substrate, or can have a portion that is disposed on the exterior surface and a portion that is disposed in an interior layer of the substrate. Certain electrical connectors can include one substrate, and other electrical connectors can include first and second substrates, thought it should be appreciated that the present disclosure is not limited to the number of substrates of the electrical connector. The electrical connector can be configured to be mounted to at least one cable so as to place the at least one cable in in electrical communication with the at least one substrate. Thus, the first complementary electrical component can be configured as at least one cable, which can be configured to transfer electrical data, optical signals, or electrical power. The electrical connector is further configured to mate to a receptacle connector that includes at least one receptacle configured to receive the mating end of a respective one of the at least one substrate, thereby establishing an electrical connection with the electrical conductors of the substrate. Thus, the second complementary electrical component can be configured as an electrical connector, such as a transceiver.

Examples of such electrical connectors include serial attached small computer system interface ("SAS") connectors and its variants, such as mini-SAS and mini-SAS HD connectors. Accordingly, reference herein to SAS connectors is intended to refer to all such SAS connectors and their variants, including but not limited to mini-SAS and mini-SAS HD, unless otherwise indicated, and all other electrical connectors that are configured to receive at least one paddle card.

Referring now to FIGS. 1A-1C, a conventional substrate 20 of a SAS connector includes a first surface 22 and a second surface 24 opposite the first surface 22 with respect to a transverse direction T. The substrate 20 is configured as a printed circuit board, and in particular as a paddle card for a SAS connector. It is appreciated that SAS connectors can be configured for use with a pair of paddle cards that are each conventionally configured as illustrated and described herein in connection with the substrate 20. The SAS connector including substrates 20 can be configured as set forth in SFF-8643 Rev 3.4 dated May 25, 2014, SFF-8644 Rev 3.3 dated Aug. 4, 2014, and SFF-8662 Rev. 2.7 dated Jul. 24, 2014, the disclosure of each of which is hereby incorporated by reference as if set forth in its entirety herein.

The conventional substrate 20 includes a first plurality of electrical contacts carried by the first surface 22, and are configured as contact pads 26 that are configured to mate with the SAS connector. The first plurality of electrical contact pads 26 can be spaced from each other along a lateral direction A that is substantially perpendicular to the transverse direction T. Similarly, the conventional substrate includes a second plurality of electrical contacts carried by the second surface 24, and are configured as contact pads 28 that are configured to mate with the SAS connector. The electrical contacts of the second plurality of electrical contact pads 28 can be spaced from each other along the lateral direction A. In particular, the substrate 20 is received by the SAS connector such that electrical contacts of the SAS connector mate with respective ones of the first and second pluralities of electrical contact pads 26 and 28.

Each of the first and second pluralities of electrical contact pads 26 and 28 includes respective signal contact pads 29 and ground contact pads 30. The signal contact pads 29 and ground contact pads 30 are elongate along a longitudinal direction L that is perpendicular to both the transverse direction T and the lateral direction A. Adjacent ones of the signal contact pads 29 with respect to the lateral direction A are arranged in pairs 32. The pairs 32 define differential signal pairs. It is recognized that the signal contact pads 29 can be alternatively be single ended. The substrate 20 includes a ground contact pad 30 disposed between respective ones of the signal contact pads 29 with respect to the lateral direction A. For instance, as illustrated, a ground contact pad 30 is carried by each of the first and second surfaces 22 and 24 at a location between adjacent ones of the pairs 32 with respect to the lateral direction A. The lateral direction A is also referred to herein as a row direction. Each of the signal contact pads 29 carried by the first surface 22 is aligned with a respective one of the signal contact pads 29 carried by the second surface 24 along the transverse direction T. Similarly, each of the signal contact pads 29 carried by the second surface 24 is aligned with a respective one of the signal contact pads 29 carried by the first surface 22 along the transverse direction T. Further, each of the ground contact pads 30 carried by the first surface 22 is aligned with a respective one of the ground contact pads 30 carried by the second surface 24 along the transverse direction T. Similarly, each of the ground contact pads 30 carried by the second surface 24 is aligned with a respective one of the ground contact pads 30 carried by the first surface 22 along the transverse direction T.

The substrate 20 further includes lead-in contact pads 34 that are carried by one or both of the first and second surfaces 22 and 24. Each of the lead-in contact pads 34 is aligned with a respective one of the signal contact pads 29 along the longitudinal direction L. Further, each of the lead-in contact pads 34 is spaced from the respective one of the signal contact pads 29 along the longitudinal direction L so as to define a gap therebetween. In particular, each of the lead-in contact pads 34 is spaced from the respective one of the signal contact pads 29 in a forward direction that is along the longitudinal direction L. In this regard, the substrate 20 defines a front end 36*a* and a rear end 36*b* that is spaced from the front end 36*a* along the longitudinal direction L. The front end 36*a* is spaced from the rear end 36*b* in the forward direction. Similarly, the rear end 36*b* is spaced from the front end 36*a* in a rearward direction that is opposite the forward direction. The forward and rearward directions are each oriented along the longitudinal direction L. During operation, the front end 36*a* of the substrate 20 is received in the receptacle of the SAS connector by way of movement of the substrate 20 in the forward direction with respect to the SAS connector.

Accordingly, the front end 36*a* of the substrate 20 can be referred to as a leading end of the substrate 20, and the rear end of the substrate 20 can be referred to as a trailing end. Similarly, each of the first plurality of contact pads 26 includes a trailing edge and a leading edge that is spaced from the trailing edge in the forward direction. For instance, each of the signal contact pads 29 includes a trailing edge 29*a* and a leading edge 29*b* spaced from the trailing edge 29*a* in the forward direction. Similarly, each of the lead-in contact pads 34 includes a trailing edge 34*a* and a leading edge 34*b* spaced from the trailing edge 34*a* in the forward direction. Each of the ground contact pads 30 includes a trailing edge 30*a* and a leading edge 30*b* spaced from the trailing edge 30*a* in the forward direction. The trailing edge 34*a* of each of the lead-in contact pads 34 is spaced from the leading edge 29*b* of the aligned one of the signal contact pads 29 along the longitudinal direction L. The lead-in contact pads 34 are electrically conductive, and can be made from the same or different material with respect to the signal contact pads 29.

In conventional Mini-SAS HD connectors, each of the signal contact pads 29 of the substrates 20 defines a signal contact pad length L1 from the trailing edge 29*a* to the leading edge 29*b* along the longitudinal direction L. The signal contact pad length L1 is approximately 1.85 mm. The term "approximately" is used herein with respect to dimensional information to indicate potential variations due to manufacturing tolerances or rounding. Further, the leading edge 29*b* of each of the signal contact pads 29 is spaced from the front end 36*a* of the substrate 20 a distance D1 along the longitudinal direction L. Further still, the leading edge 29*b* of each of the signal contact pads 29 is spaced from the rear end 36*b* of the substrate 20 a distance D2 along the longitudinal direction L. Each of the lead-in contact pads 34 defines a lead-in contact pad length L2 measured from the trailing edge 34*a* to the leading edge 34*b* along the longitudinal direction L. The trailing edge 34*a* of each of the lead-in contact pads 34 is spaced from the leading edge 29*b* of the respective aligned one of the signal contact pads 29 a distance D3 along the longitudinal direction L. That is, the gap that separates the lead-in contact pads 34 from the aligned ones of the signal contact pads 29 defines the distance D3 along the longitudinal direction L.

The signal contact pads 29 further define a contact location 38 between the trailing edge 29*a* and the leading edge 29*b*. In particular, as the substrate 20 is received in the receptacle of the second complementary electrical component, signal contacts of the second complementary electrical component can wipe along the lead-in contact pads 34 before being brought into physical and electrical contact with the signal contact pads 29 at the contact location 38. When the electrical connector is fully mated with the second complementary electrical component, the substrate 20 is fully seated in the receptacle of the second complementary electrical component. When the substrate 20 is fully seated in the receptacle of the second complementary electrical component, the signal contacts of the complementary electrical component are in physical contact with the signal contact pads 29 at the contact location 38. The contact location 38 is spaced a distance D4 from the front end 36*a* of the substrate 20 along the longitudinal direction L. The contact location 38 is spaced a distance D5 from the rear end 36*b* of the substrate 20 along the longitudinal direction L. Further, in conventional Mini-SAS HD connectors, the contact location 38 is spaced from the leading edge 29*b* of the signal contact pads 29 along the longitudinal direction L a distance D6 of approximately 1.75 mm. Thus, the contact location 38 is spaced from the trailing edge 29*a* of the signal contacts along the longitudinal direction a distance of approximately 0.1 mm. The lengths L1-L2 and distances D1-D6, as described herein, apply to both the first and second surfaces 22 and 24 of the substrate 20.

SUMMARY

In one aspect of the present disclosure, a substrate is configured to be received by an electrical connector. The substrate can include a trailing end and a leading end spaced from the trailing end in a direction of insertion of the substrate into the electrical connector. The substrate can further include at least one surface, and at least one electrical signal contact pad carried by the at least one surface. The at least one electrical signal contact pad can define a leading edge and a trailing edge spaced from the leading edge in the direction of insertion. The electrical signal contact pad can define a signal contact pad length from the leading edge to the trailing edge that is less than another signal contact pad length of a signal contact pad of another substrate that is configured to be received by the electrical connector by an offset distance.

BRIEF DESCRIPTION OF THE DRAWINGS

The foregoing summary, as well as the following detailed description of example embodiments of the application, will be better understood when read in conjunction with the appended drawings, in which there is shown in the drawings example embodiments for the purposes of illustration. It should be understood, however, that the application is not limited to the precise arrangements and instrumentalities shown. In the drawings.

DETAILED DESCRIPTION

Figure 1A:
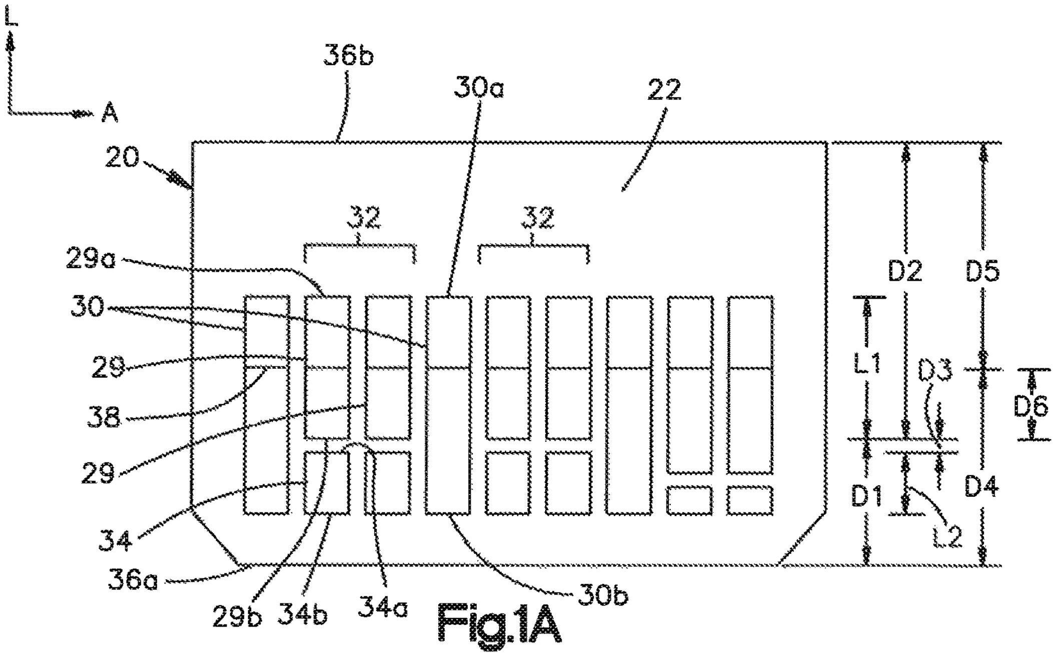
FIG. 1A is a top plan view of a first surface of a conventional paddle card of an electrical connector.
Figure 1B:
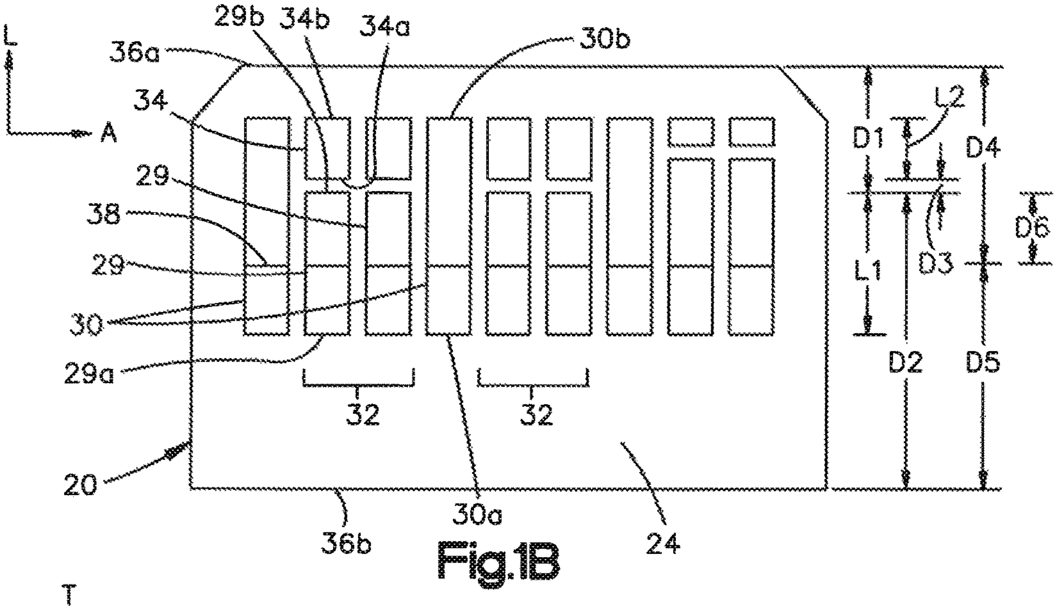
FIG. 1B is a bottom plan view of the paddle card illustrated in FIG. 1A.
Figure 1C:
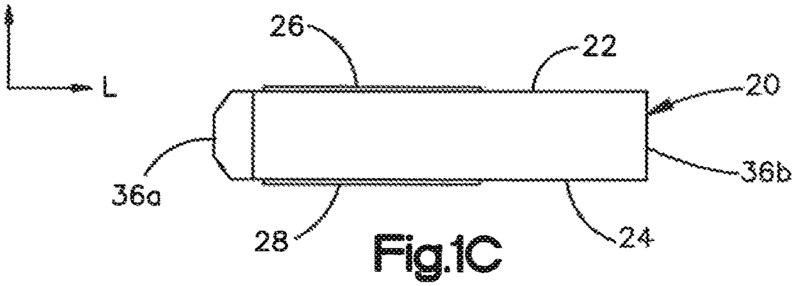
FIG. 1C is a side elevation view of the paddle card illustrated in FIG. 1A.
Figure 2A:
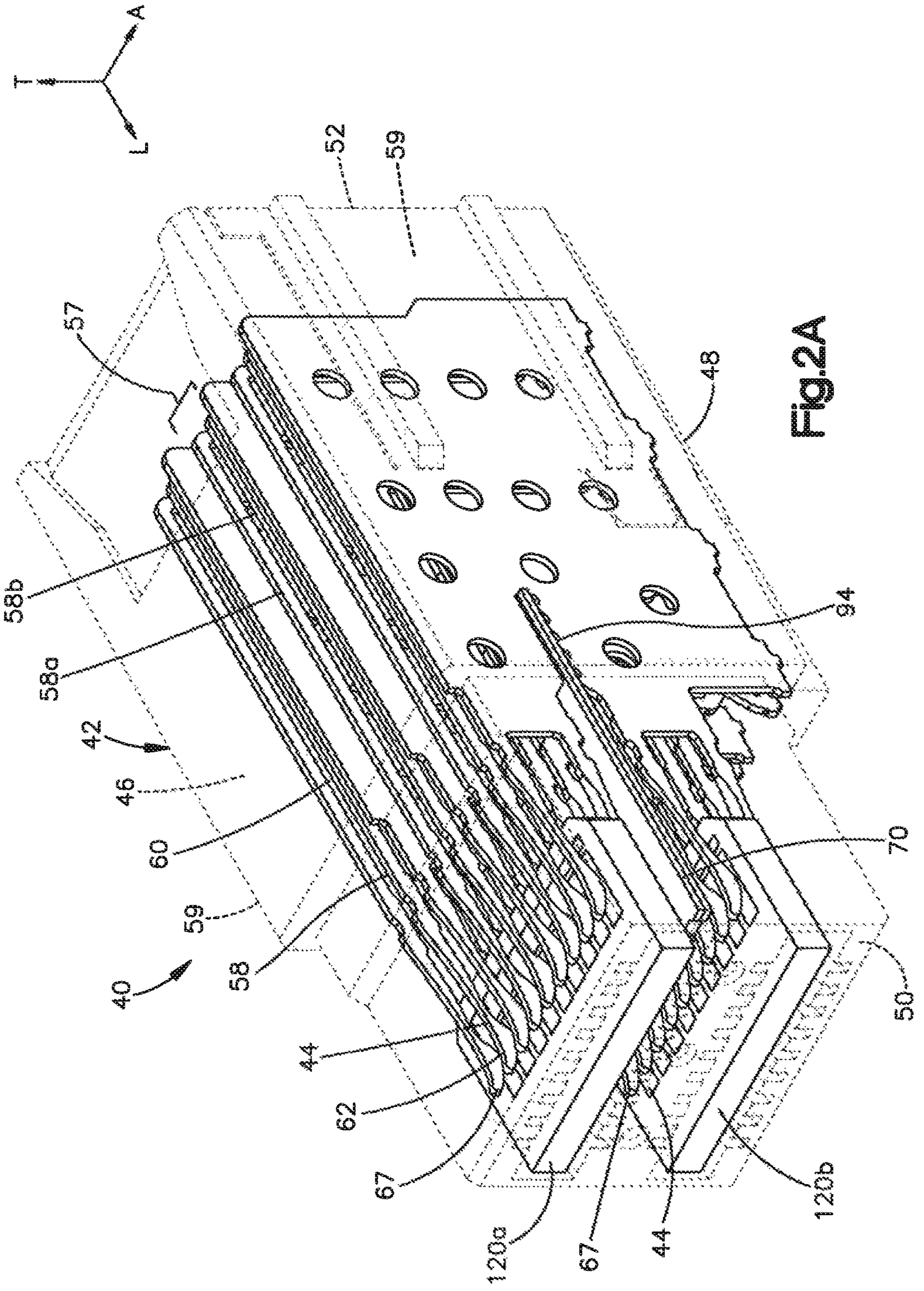
FIG. 2A is a perspective view of a SAS connector and a pair of identical paddle cards received by the SAS connector, the paddle cards constructed in accordance with one embodiment.
Figure 2B:
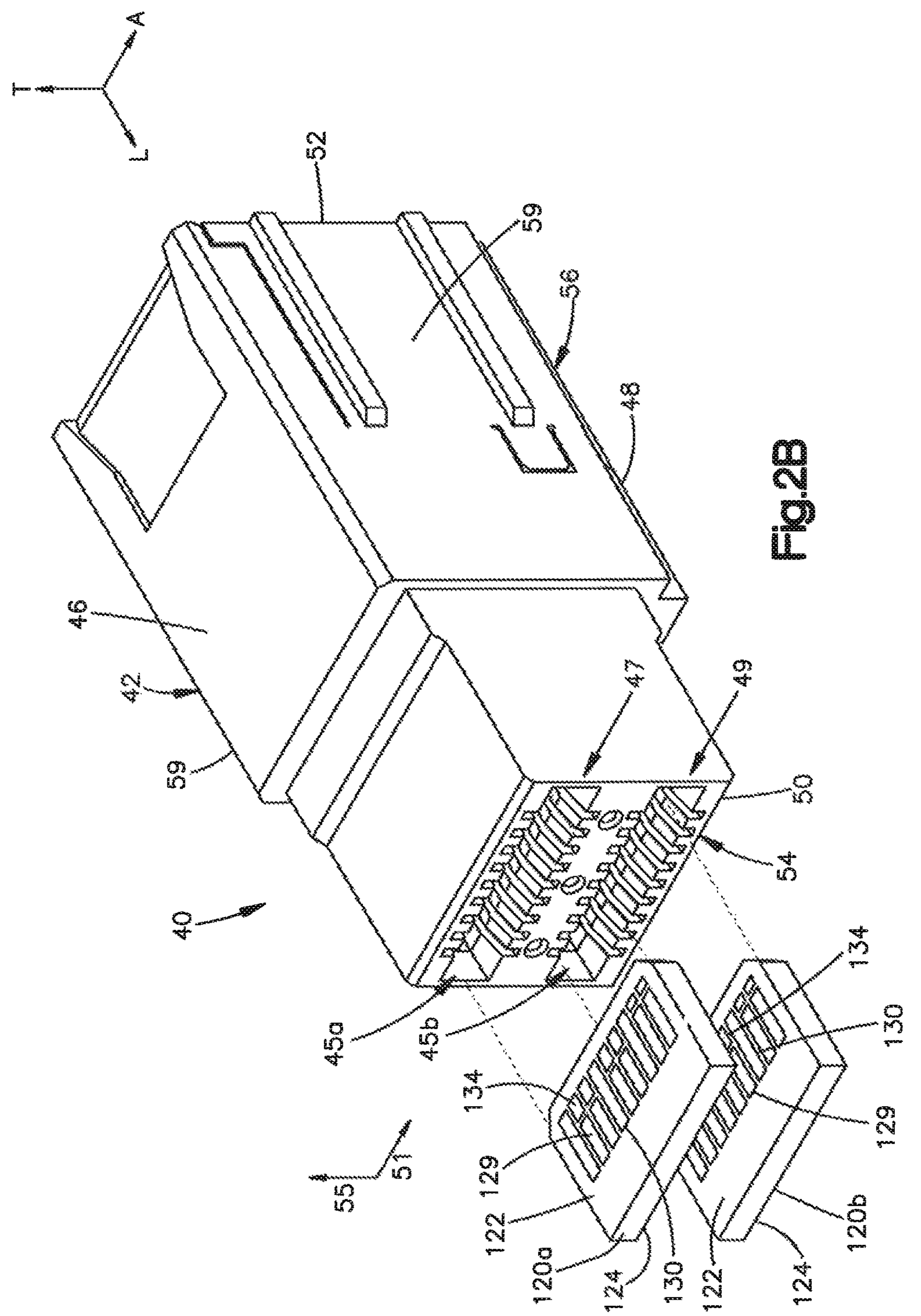
FIG. 2B is an exploded perspective view of the SAS connector and paddle cards illustrated in FIG. 2A.
Figure 2C:
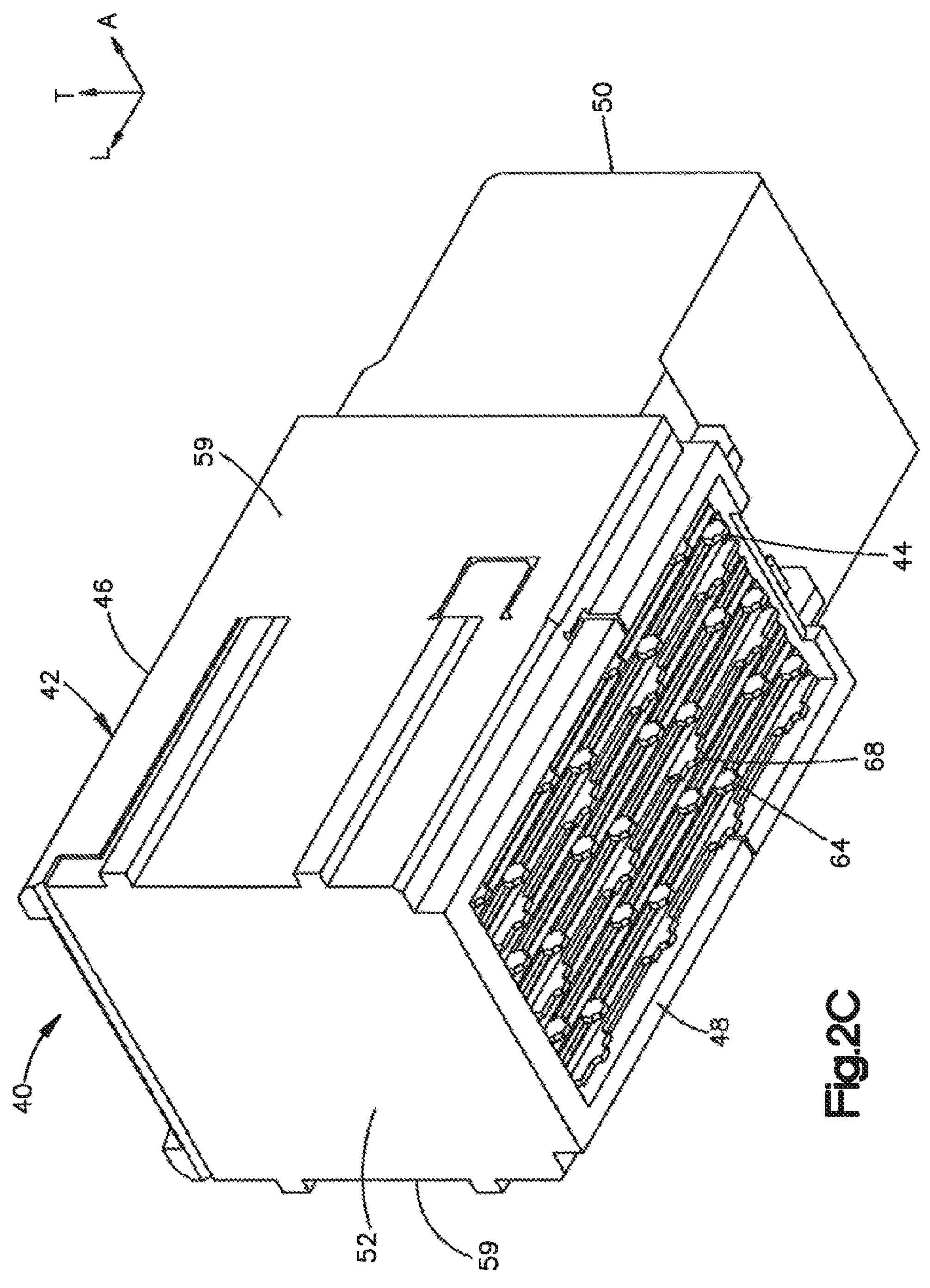
FIG. 2C is another perspective view of the SAS connector illustrated in FIG. 2A.
Figure 2D:
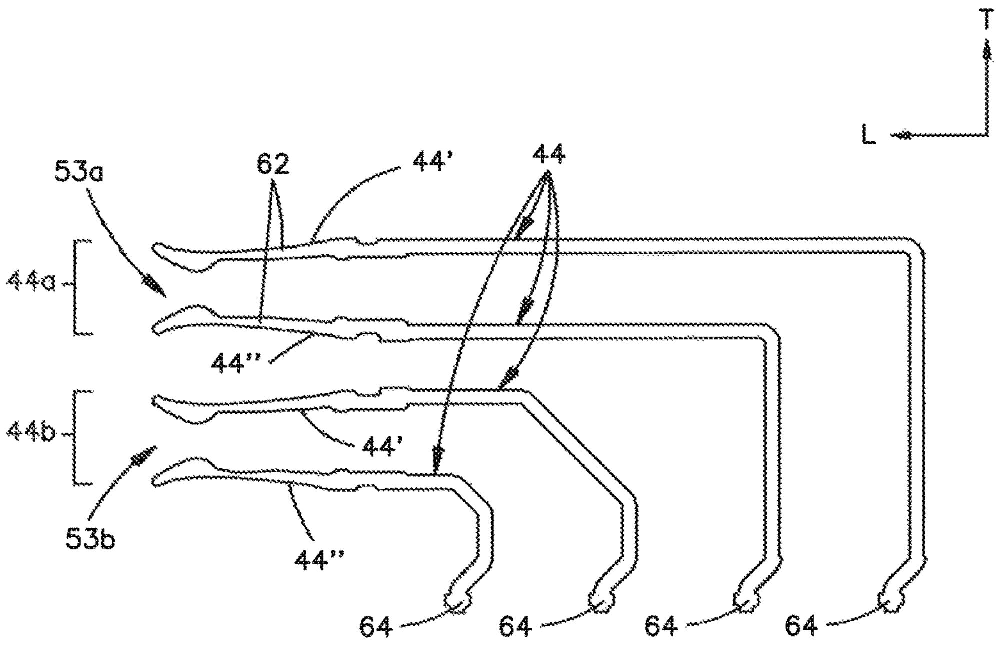
FIG. 2D is a side elevation view of a plurality of signal contacts of the electrical connector illustrated in FIG. 2A.
Figure 2E:
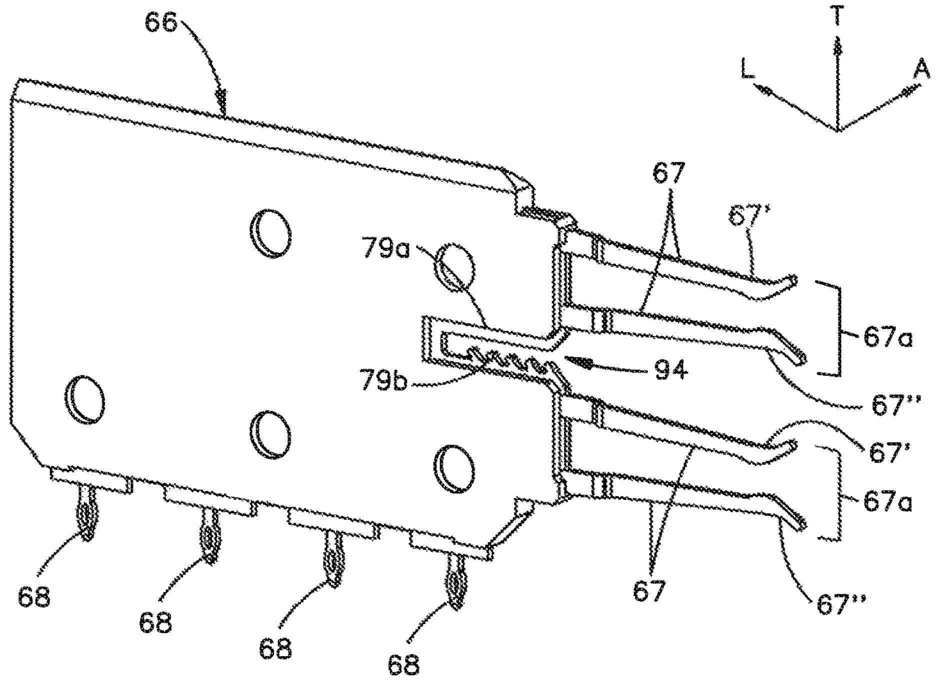
FIG. 2E is a side elevation view of a ground plate of the electrical connector illustrated in FIG. 2A.

Referring now to FIGS. 2A-2E, an electrical connector 40, such as a SAS connector, includes an electrically insulative connector housing 42 and a plurality of electrical contacts 44 supported by the connector housing 42. The electrical contacts 44 can be configured as signal contacts as described below. The electrical connector 40 is configured to mate with first and second substrates **120*a* and 120*b*. The first and second substrates 120*a* and 120*b* can be configured as paddle cards for the SAS connector. As is described in more detail below, the first and second substrates 120*b* can include signal contact pads 129 and lead-in contact pads 134 that differ from the substrate 20 described above with respect to FIGS. 1A-1C**.

When the electrical connector 40 is mounted to a third substrate, the electrical contacts 44 are electrically connected to complementary electrical traces of the third substrate, thereby placing the electrical connector 40 in electrical communication with the third substrate. The third substrate can be configured as a printed circuit board. When the electrical connector 40 is mated to the first and second substrates **120*a* and 120*b*, the electrical contacts 44 are placed in electrical communication with complementary electrical traces of each of the first and second substrates 120*a* and 120*b*. Accordingly, when the electrical connector 40 is mounted to the third substrate and mated with the first and second substrates 120*a* and 120*b*, each of the first and second substrates 120*a* and 120*b*** is placed in electrical communication with the third substrate.

The connector housing 42 defines a top end 46 and a bottom end 48 that is opposite the top end 46 along the transverse direction. The connector housing 42 further defines a front end 50 and a rear end 52 that is opposite the front end 50 along the longitudinal direction L. For instance, the front end 50 is spaced from the rear end 52 in a forward direction of the electrical connector 40 that is opposite the forward direction of the substrates **120*a* and 120*b*. The connector housing 42 further includes opposed sides 59 that are spaced from each other along the lateral direction A. In accordance with the illustrated embodiment, the transverse direction T is oriented vertically, and the longitudinal and lateral directions L and A are oriented horizontally, though it should be appreciated that the orientation of the connector housing 42 may vary during use. The electrical connector 40 defines a row direction 51 that can extend along the lateral direction A, parallel to the direction of elongation of the third substrate, and a column direction 55 that is substantially perpendicular to the row direction 51** and can extend along the transverse direction T, and thus substantially perpendicular to the direction of elongation of the third substrate.

The connector housing 42 defines a mating interface 54 disposed proximate to the front end 50 and a mounting interface 56 disposed proximate to the bottom end 48. The mounting interface 56 is configured to operatively engage the third substrate when the electrical connector 40 is mounted to the third substrate. The mating interface 54 is configured to operatively engage the first and second substrates **120*a* and 120*b* when the electrical connector 40 is mated with the first and second substrates 120*a* and 120*b*. The connector housing 42 defines at least one receptacle such as a first or upper receptacle 45*a* and a second or lower receptacle 45*b* that is spaced from the first or upper receptacle 45*a* along the transverse direction T. The receptacles 45*a-b* are disposed at mating interface 54, and configured to receive corresponding electrical components, such as the first and second substrates 120*a* and 120*b*, respectively. Each of the receptacles 45*a* and 45*b* extends into the front end 50 of the connector housing 42. The first receptacle 45*a* extends along a first or upper row 47, and the second receptacle 45*b* extends along a second or lower row 49 that is spaced below the first or upper row 47 along the transverse direction T. Thus, the upper and lower rows 47 and 49 are spaced from each other along the column direction 55. Each of the first or upper row 47 and the second or lower row 49 are elongate along the row direction 51, and thus extend substantially parallel to each other. Each of the receptacles 45*a-b* extends laterally into the front end 36, and is sized such that respective leading edges of the first and second substrates 120*a* and 120*b* are configured to be inserted into the receptacles 45*a* and 45*b*, respectively, of the first and second rows 47 and 49, respectively. Thus, the first and second substrates 120*a* and 120*b* can be described as vertically stacked when mated to the electrical connector 40**.

In accordance with the illustrated embodiment, the electrical connector 40 includes a plurality of leadframe assemblies 58 that each include a respective electrically insulative leadframe housing 60 and respective select ones of the plurality of electrical contacts 44 that are supported by the leadframe housing 60. The electrical contacts 44 supported by the leadframe housings 60 can be configured as signal contacts in accordance with the illustrated embodiment. Thus, the leadframe assemblies 58 can be referred to as signal leadframe assemblies. The plurality of leadframe assemblies 58 can be provided as insert molded leadframe assemblies (IMLAs) whereby the leadframe housing 60 is overmolded onto the respective electrical contacts 44. The leadframe assemblies 58 are supported by the connector housing 42 and arranged such that adjacent leadframe assemblies 58 are spaced along the row direction 51.

The leadframe assemblies 58 can include at least one first select leadframe assembly **58*a* of the plurality of leadframe assemblies 58, such as a plurality of first select leadframe assemblies 58*a* of the leadframe assemblies 58, and at least one second select leadframe assembly 58*b* of the plurality of leadframe assemblies 58, such as a plurality of second select leadframe assemblies 58*b* of the plurality of leadframe assemblies 58. The first assemblies 58 can be arranged in leadframe pairs 57 that each include one of the first select leadframe assemblies 58***a* and one of the second select leadframe assemblies 58*b* that are disposed adjacent to each other along the row direction 51. Aligned contacts 44 of the adjacent leadframe assemblies 48 along the row direction 51 define differential signal pairs. Otherwise stated, adjacent electrical contacts 44 of the respective leadframe pairs 57 define differential signal pairs. Thus, because the electrical contacts 44 of the pairs 57 of adjacent leadframe assemblies 58 whose broadsides face each other define differential signal pairs, the electrical contacts 44 can be said to be broadside-coupled. Furthermore, because adjacent electrical contacts 44 along the row direction 51 define differential signal pairs, the electrical connector 40 can be referred to as a row-based electrical connector.

Each of the respective electrical contacts 44 of each leadframe assembly 58 defines a mating portion 62 that extends laterally forward from the corresponding leadframe housing 60. Each of the respective electrical contacts 44 of each leadframe assembly 58 further defines a mounting portion 64 that extends down from the corresponding leadframe housing 60. The mating portions 62 are configured to electrically mate with a complementary one of the first and second substrates 120*a* and 120*b* at respective contact locations 138, as described below. The mounting portions 64 can be configured as mounting tails that can be press-fit into complementary apertures extending into or through the third substrate. Alternatively, the mounting portions 64 can be configured to be surface mounted to the respective third substrate, or otherwise mounted to the third substrate as desired so as to place the electrical contacts 44 in electrical communication with corresponding electrical traces of the third substrate. Thus, the electrical connector 40 can be mated with at least one substrates, such as first and second substrates 120*a* and 120*b*, so as to place the third substrate in electrical communication with at the least one substrate to which the electrical connector 40 is mated.

The leadframe assemblies 58 can include as many electrical contacts 44 as desired that are spaced along a column direction 55 that is perpendicular to the row direction 51. The column direction 55 can be oriented along the transverse direction T. In accordance with the illustrated embodiment, each leadframe assembly 58 defines at least one pair of electrical contacts 44. For example, each leadframe assembly 58 can define a first or upper pair 44*a* of electrical contacts 44, and a second or lower pair 44*b* of electrical contacts 44. Each pair 44*a* and 46*b* can be defined by a first electrical contact 44' and a second electrical contact 44". When the leadframe assemblies 58 are supported by the connector housing 42, the mating portions 62 of the first and second electrical contacts 44' and 44" of the upper pair 44*a* extend into the first receptacle 45*a* that is elongate along the upper row 47, and the mating portions 62 of the first and second electrical contacts 44' and 44" of the lower pair 44*b* extend into the second receptacle 45*b* that is elongate along the lower row 49.

The mating portions 62 of each of the first and second electrical contacts 44' and 44" of the upper pair 44*a* are spaced apart along the transverse direction T in the first receptacle 45*a*, and are placed in electrical communication with opposed upper and lower surfaces of the first substrate 120*a* when the first substrate 120*a* is inserted into the upper receptacle 45*a*. The mating portions 62 of each of the first and second electrical contacts 44' and 44" are spaced apart along the transverse direction T in the lower receptacle 45*b*, and are placed in electrical communication with opposed surfaces of the second substrate 120*b* when the second substrate 120*b* is inserted into the lower receptacle 45*b*. In this regard, the mating portions 62 of first and second ones of the electrical contacts 44 of a corresponding leadframe assembly 58 define at least one substrate-receiving gap that is configured to receive a paddle card paddle card in electrical communication with the third substrate. For instance, the mating portions 62 of the first and second electrical contacts 44' and 44" of the upper pair 44*a* define a first substrate-receiving gap 53*a* that is configured to receive the first substrate 120*a* such that the mating portions 62 of the first and second electrical contacts 44' and 44" of the upper pair 44*a* engage opposed surfaces of the first substrate 120*a*. The mating portions 62 of each of the first and second electrical contacts 44' and 44" of the lower pair 44*b* define a second substrate-receiving gap 53*b* that is configured to receive the second substrate 120*b* such that the mating portions 62 of each of the first and second electrical contacts 44' and 44" of the lower pair 44*b* engage opposed surfaces of the second substrate 120*b*.

The respective electrical contacts 44 of adjacent leadframe assemblies 58, for instance electrical contacts 44 that are aligned along the row direction 51, can define differential signal pairs. In accordance with the illustrated embodiment, each of the first and second electrical contacts 44' and 44" of each of the upper and lower pairs 44*a* and 44*b*, respectively, of a first one of the leadframe assemblies 58 and each of the first and second electrical contacts 44' and 44" of each of the upper and lower pairs 44*a* and 44*b*, respectively, of a second one of the leadframe assemblies 58 that is adjacent the first one of the leadframe assemblies 58 define respective differential signal pairs. For instance, the first electrical contact 44' of the upper pair 44*a* of a first one of the leadframe assemblies 58 and the first electrical contact 44' of the upper pair 44*a* of a second one of the leadframe assemblies 58 that is adjacent the first one of the leadframe assemblies 58 can define a first differential signal pair. Furthermore, the second electrical contact 44" of the upper pair 44*a* of the first one of the leadframe assemblies 548 and the second electrical contact 44" of the upper pair 44*a* of the second one of the leadframe assemblies 58 can define a second differential signal pair. Further still, the first electrical contact 44' of the lower pair 44*b* of the first one of the leadframe assemblies 58 and the first electrical contact 44' of the lower pair 44*b* of the second one of the leadframe assemblies 58 can define a third differential signal pair. Further still, the second electrical contact 44" of the lower pair 44*b* of the first one of the leadframe assemblies 58 and the second electrical contact 44" of the lower pair 44*b* of the second one of the leadframe assemblies 58 can define a fourth differential signal pair.

Because the mating portions 62 of the upper and lower pairs 44*a* and 44*b* of the electrical contacts 44 are arranged so as to receive the first and second substrates 120*a* and 120*b*, respectively, the electrical contacts 44 can be referred to as receptacle contacts and the electrical connector 40 can be referred to as a receptacle connector. Furthermore, because the mating portions 62 of the electrical contacts 44 are oriented substantially perpendicular with respect to the mounting portions 64, the electrical connector 40 can be described as a right-angle connector. Alternatively, the electrical connector 40 can be configured as a vertical connector whose mating portions 62 are oriented substantially parallel with respect to the mounting portions 64. For instance, the mounting portions 64 can extend rearward from the rear ends of the leadframe housings 60.

The electrical connector 40 can further include a plurality of ground plates 66 that can be metallic. Alternatively, the ground plates 66 can be electrically absorptive. For instance, the ground plates 66 can be made from an electrically absorptive lossy material. Thus, the ground plates 66 can be made from a metallic or non-metallic material. Each ground plate 66 can be oriented in a vertical plane that is defined by the transverse T and lateral A directions, and extend vertically and laterally a sufficient distance so as to overlap at least part up to all of at least one up to all of the adjacent electrical contacts 44 with respect to the row direction 51. Thus, a line extending along the row direction 51 passes through at least one of the electrical contacts 44 of the leadframe assembly 58 that is adjacent the ground plate 66 along the row direction 51, and further passes through the ground plate 66. The leadframe assemblies 58 and the ground plates 66 can be supported by the connector housing 42 and arranged such that the ground plates 66 are disposed between adjacent leadframe pairs 57, such as adjacent first and second ones of the leadframe assemblies 58. Accordingly, a line extending along the row direction 51 that passes through a broadside coupled differential signal pair of electrical contacts 44 of a corresponding leadframe pair 57 can pass through the ground plate 66 after passing through the differential signal pair. Further, the ground plates 66 can define metallic electromagnetic shields that are disposed between at least one pair of differential signal pairs defined by the adjacent leadframe pairs 57.

Furthermore, at least one of the ground plates 66 up to all of the ground plates 66 can define a plurality of mating portions 67 that can be aligned with the mating portions 62 of respective of the electrical contacts 44 along the row direction 51. In accordance with the illustrated embodiment, the mating portions 67 can be configured as fingers that project forward from the respective ground plates 66 along the longitudinal direction L. The mating portions 67 can be shaped substantially identically with the aligned mating portions 62 of the electrical contacts 44 as illustrated, or can be shaped differently as desired. In accordance with the illustrated embodiment, each ground plate 66 defines at least one pair of mating portions 67, such as a first or upper pair 67*a* of mating portions 67 and a second or lower pair 67*b* of mating portions that are electrically commoned, or electrically connected, together via the respective ground plate 66. Thus, an electrical path is established between each of the mating portions 67 through the plate body 66. For instance, each pair 67*a* and 67*b* of mating portions 67 can include a first mating portion 67' and a second mating portion 67". When the ground plates 66 are supported by the connector housing 42, each of the first and second mating portions 67' and 67" of the upper pair 67*a* can extend into the upper receptacle 45*a* that is elongate along the first row 47, and the each of the first and second mating portions 67' and 67" of the lower pair 67*b* extend into the lower receptacle 45*b* that is elongate along the second row 49. Thus, the mating portions 67 of the upper pair 67*a* can be aligned with the mating portions 62 of the electrical contacts 44 of the upper pair 44*a* along the row direction 51, and can be shaped substantially identically to the mating portions 62 of the electrical contacts 44 of the upper pair 44*a* of each leadframe assembly 58. Likewise, the mating portions 67 of the lower pair 67*b* are aligned with the mating portions 62 of the electrical contacts 44 of the lower pair 44*b* along the row direction 51, and can be shaped substantially identically to the mating portions 62.

During operation of the electrical connector 40, the upper receptacle 45*a* is configured to receive the first substrate 120*a*, such that a first surface 122 of the first substrate 120*a* is placed in electrical communication with both 1) the first mating portions 67' of the upper pair 67*a*, and 2) the mating portion 62 of the first electrical contacts 44' of the upper pair 44*a* of electrical contacts 44. Similarly, a second surface 124 of the first substrate 120*a* is placed in electrical communication with both 1) the second mating portions 67" of the upper pair 67*a*, and 2) the mating portion 62 of the second electrical contacts 44" of the upper pair 44*a* of electrical contacts 44. Likewise, during operation of the electrical connector 40, the lower receptacle 45*b* is configured to receive the second substrate 120*b*, such that a first surface of the second substrate 120*b* is placed in electrical communication with both 1) the first mating portions 67' of the lower pair 67*b*, and 2) the mating portion 62 of the first electrical contacts 44' of the lower pair 44*b* of electrical contacts 44. Similarly, a second surface of the second substrate 120*b* is placed in electrical communication with both 1) the second mating portions 67" of the lower pair 67*b*, and 2) the mating portion 62 of the second electrical contacts 44" of the lower pair 44*b* of electrical contacts 44.

At least one of the ground plates 66 up to all of the ground plates 66 can further define a plurality of mounting portions 68, which can be configured as mounting tails that project down from the respective ground plates 66 and are configured to be press-fit into apertures of the third substrate. Alternatively, the mounting portions 68 can be surface mounted to the third substrate. The mounting portions 68 are electrically commoned together and further electrically commoned with the mating portions 67 via the ground plate 66. Thus, each of the ground plates 66 establishes an electrical path between the respective mounting portions 68 and the mating portions 68. Thus, the ground plates 66 define ground contacts that are connected between the third substrate and at least one paddle card, such as the first and second substrates 120*a* and 120*b*. Each of the ground plates 66 can be overmolded by a ground leadframe housing to define a ground leadframe assembly as desired. Further, each of the ground plates 66 can include opposed surfaces 79*a* and 79*b* that define a slot 94 configured to receive an electrically conductive ground commoning member 70 that is in contact with each of the ground plates 66, and electrically isolated from the electrical contacts 44. The ground commoning member 70 is described in more detail in U.S. Pat. No. 8,480,413.

The substrates 120*a* and 120*b* will now be described with reference to the substrate 120 illustrated in FIGS. 3A-4. In accordance with the present disclosure, the substrate 120 is substantially identical to the conventional substrate 20 described above, but having a reduction in length of the signal contact pads along the longitudinal direction L. Additionally, the substrate 120 can have an increase in length of the lead-in contact pads as desired. The term "substantially" is used herein to describe the substrates 120*a* and 120*b* as being substantially identical to the conventional substrate 20 to indicate potential variations due to manufacturing tolerances. It is further appreciated that the trailing edges are not believed to substantially affect performance of the substrates, and thus can be positioned differently between the conventional substrate 20 and the substrates 120*a-b* without departing from the substantial identical nature of the conventional substrate 20 and the substrates 120*a-b*. The first and second substrates 120*a* and 120*b* can be configured as described herein with respect to the substrate 120 illustrated in FIGS. 2A-4.

Figure 3A:
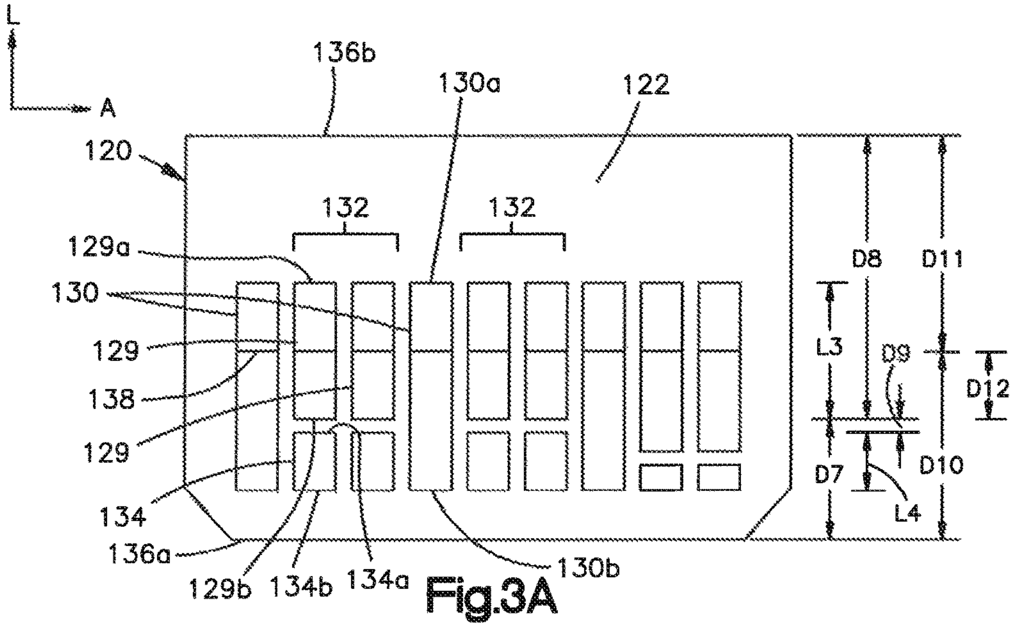
FIG. 3A is a top plan view of a first surface of one of the paddle cards illustrated in FIG. 2A.
Figure 3B:
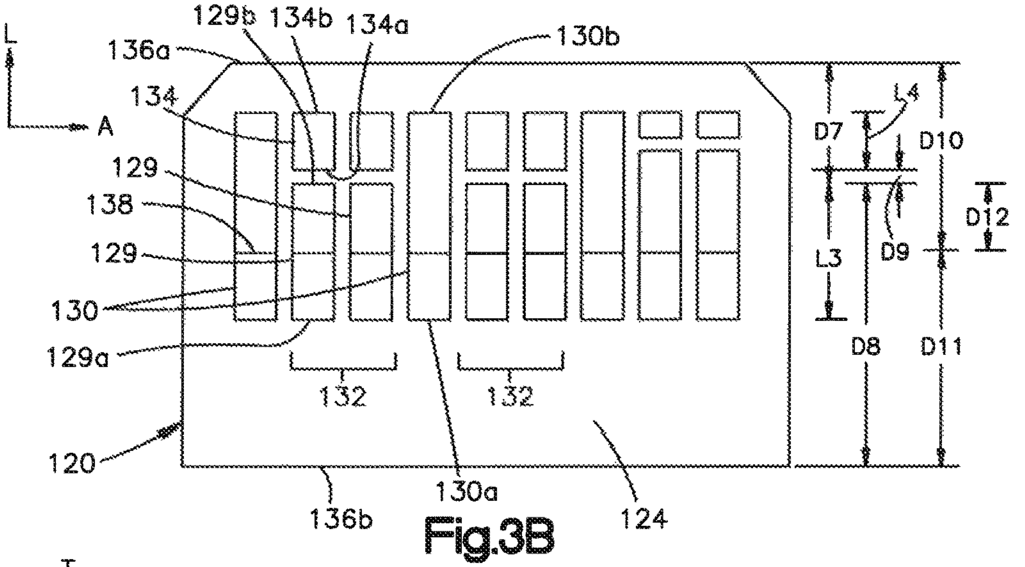
FIG. 3B is a bottom plan view of the paddle card illustrated in FIG. 3A.
Figure 3C:
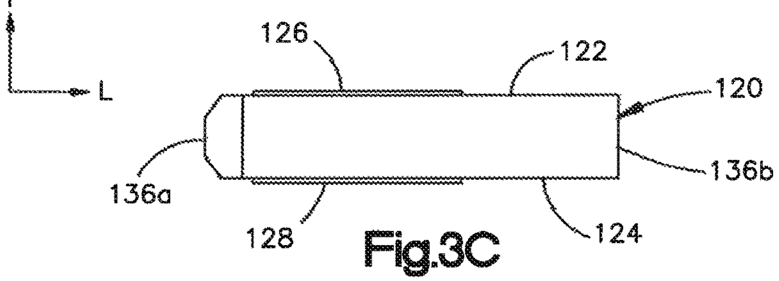
FIG. 3C is a side elevation view of the paddle card illustrated in FIG. 3A.
Figure 4:
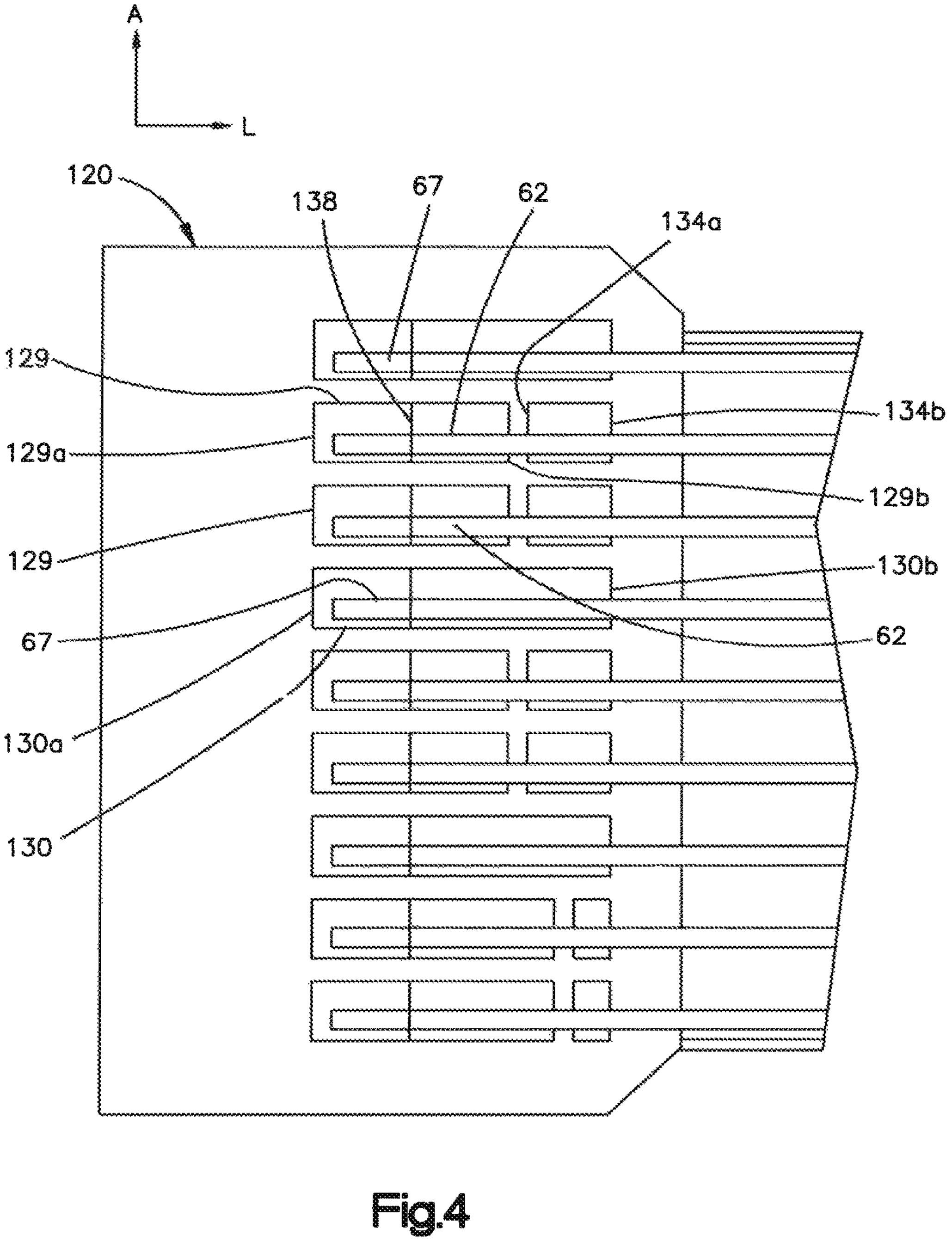
FIG. 4 is a top plan view showing electrical contacts of the SAS connector illustrated in FIG. 2A shown mated to the paddle card illustrated in FIG. 3A when the paddle card is fully seated in the SAS connector.

Referring now to FIGS. 3A-3C, the substrate 120 of the electrical connector 40 includes a first surface 122 and a second surface 124 opposite the first surface 122 with respect to the transverse direction T. The substrate 120 is configured as a printed circuit board, and in particular as a paddle card for a SAS connector. It is appreciated that certain ones of the electrical connectors 40 can be configured to receive first and second substrates so as to mate with the first and second paddle cards. Alternatively, certain ones of the electrical connectors 40 can be configured to receive a single substrate so as to mate with the single paddle card.

The substrate 120 includes a first plurality of electrical contacts carried by the first surface 22, and are configured as a first plurality of electrical contact pads 126 that are configured to mate with the electrical connector 40. The first plurality of electrical contact pads 126 can be spaced from each other along the lateral direction A. Similarly, the substrate 120 includes a second plurality of electrical contacts carried by the second surface 24, and are configured as a second plurality of contact pads 128 that are configured to mate with the electrical connector 40. The electrical contacts of the second plurality of electrical contact pads 128 can be spaced from each other along the lateral direction A. In particular, the substrate 120 is received by the electrical connector 40 such that mating portions 62 and 67 of the electrical connector 40 mate with respective ones of the first and second pluralities of electrical contact pads 126 and 128. In particular, ones of the first plurality of contact pads 126 are configured to mate with the mating portions 62 of respective ones of the first electrical contacts 44' and the first mating portions 67' as described above. Ones of the second plurality of contact pads 128 are configured to mate with the mating portions 62 of respective ones of the second electrical contacts 44" and the second mating portions 67" as described above.

Each of the first and second pluralities of electrical contact pads 126 and 128 includes respective signal contact pads 129 and ground contact pads 130 that can be carried by each of the first and second surfaces 122 and 124, respectively. The ground contact pads 130 at the first surface 122 can be commoned together. Further, the ground contact pads 130 at the second surface 124 can be commoned together. The signal contact pads 129 are configured to mate with the mating portions 62, and the ground contact pads 130 are configured to mate with the mating portions 67. The signal contact pads 129 and the ground contact pads 130 are elongate along a longitudinal direction L. Adjacent ones of the signal contact pads 129 with respect to the lateral direction A can be arranged in pairs 132. The pairs 132 can define differential signal pairs. It is recognized that the signal contact pads 129 can be alternatively be single ended.

The substrate 120 includes a ground contact pad 130 disposed between respective ones of the signal contact pads 129 with respect to the lateral direction A. For instance, as illustrated, a ground contact pad 130 is carried by each of the first and second surfaces 122 and 124 at a location between adjacent ones of the pairs 132 with respect to the lateral direction A. The lateral direction A is also referred to herein as a row direction. Each of the signal contact pads 129 carried by the first surface 122 can be aligned with a respective one of the signal contact pads 129 of the contact pads 128 carried by the second surface 124 along the transverse direction T. For instance, the first and second surfaces 22 and 24 can be substantially identical mirror images of each other. Similarly, each of the signal contact pads 129 carried by the second surface 124 can be aligned with a respective one of the signal contact pads 129 carried by the first surface 122 along the transverse direction T. Further, each of the ground contact pads 130 carried by the first surface 122 can be aligned with a respective one of the ground contact pads 130 carried by the second surface 124 along the transverse direction T. Similarly, each of the ground contact pads 130 carried by the second surface 124 can be aligned with a respective one of the ground contact pads 130 carried by the first surface 122 along the transverse direction T.

The substrate 120 further includes lead-in contact pads 134 that are carried by one or both of the first and second surfaces 122 and 124. Each of the lead-in contact pads 134 is aligned with a respective aligned one of the signal contact pads 129 along the longitudinal direction L. Further, each of the lead-in contact pads 134 is spaced from the respective aligned one of the signal contact pads 129 along the longitudinal direction L so as to define a gap therebetween. The mating portions 62 (see FIG. 2D) are configured to ride along the lead-in contact pads 134 prior to riding along the signal contact pads 129 as the substrate 120 is inserted into a receptacle of the electrical connector 40.

Each of the lead-in contact pads 134 is spaced from the respective one of the signal contact pads 129 in a forward direction that is along the longitudinal direction L. Thus, the lead-in contact pads 134 are disposed between the signal contact pads 129 and the front end **136*a* of the substrate 120. In this regard, the substrate 120 defines a front end 136*a* and a rear end 136*b* that is spaced from the front end 136*a* along the longitudinal direction L. The front end 36*a* is spaced from the rear end 36*b* in the forward direction. The forward direction of the substrate 120 is opposite the forward direction of the electrical connector 40. Similarly, the rear end 36*b* is spaced from the front end 36*a* in a rearward direction that is opposite the forward direction. The rearward direction of the substrate 120 is opposite the rearward direction of the electrical connector 40. The forward and rearward directions of the substrate 120 are each oriented along the longitudinal direction L. During operation, the front end 136*a* of the substrate 120 is received in the receptacle of the electrical connector 40 by way of movement of the substrate 120 in the forward direction with respect to the electrical connector 40**.

Accordingly, the front end **136*a* of the substrate 120 can be referred to as a leading end of the substrate 120, and the rear end of the substrate 120 can be referred to as a trailing end. Similarly, each of the first plurality of contact pads 126 and 128 includes a trailing edge and a leading edge that is spaced from the trailing edge in the forward direction. For instance, each of the signal contact pads 129 includes a trailing edge 129*a* and a leading edge 129*b* spaced from the trailing edge 129*a* in the forward direction. Similarly, each of the lead-in contact pads 134 includes a trailing edge 134*a* and a leading edge 134*b* spaced from the trailing edge 134*a* in the forward direction. Each of the ground contact pads 130 includes a trailing edge 130*a* and a leading edge 130*b* spaced from the trailing edge 130*a* in the forward direction. The leading edges 134*b* of the lead-in contact pads 134 can be aligned with the leading edges 130*b* of the ground contact pads 130 along the lateral direction A. The trailing edge 134*a* of each of the lead-in contact pads 134 is spaced from the leading edge 129*b* of the aligned one of the signal contact pads 129 along the longitudinal direction L. The lead-in contact pads 134 are electrically conductive, and can be made from the same or different material with respect to the signal contact pads 129**.

The leading edges **129*b* can be aligned with each other along a respective plane that is defined by the lateral direction A and the transverse direction T. Further, the trailing edges 129*a* can be aligned with each other along a plane that is defined by the lateral direction A and the transverse direction T. Further, the leading edges 134*b* can be aligned with each other along a plane that is defined by the lateral direction A and the transverse direction T. Further, the trailing edges 134***a* can be aligned with each other along a plane that is defined by the lateral direction A and the transverse direction T. Further still, the leading edges 130*b* can be aligned with each other along a plane that is defined by the lateral direction A and the transverse direction T. Further still, the trailing edges 130*a* can be aligned with each other along a plane that is defined by the lateral direction A and the transverse direction T. It is appreciated that the leading ends and leading edges are identified with respect to a direction of insertion, or mating direction, of the substrate 120 into the electrical connector 40. It is appreciated that the direction of insertion, or mating direction, is oriented along the longitudinal direction L.

Each of the signal contact pads 129 defines a signal contact pad length L3 from the trailing edge 129*a* to the leading edge 129*b* along the longitudinal direction L. The signal contact pad length L3 is less than the signal contact length L1 of the conventional substrate 20 described above by an offset distance. Accordingly, the signal contact length L3 is less than 1.85 mm. In one example, the offset distance can be approximately 0.2 mm. Thus, the signal contact length L3 can be approximately 1.65 mm. It should be appreciated that the offset distance can be within a range of 5-25% of the signal contact length L1 of the signal contact pads 29 of the conventional substrate 20, such as approximately 10-15% less than the signal contact length L1, such as approximately 11% less than the signal contact length L1. The term "approximately" is used herein with respect to percentages to indicate potential variations due to manufacturing tolerances, or due to rounding.

The reduction in signal contact length L3 compared to the signal contact length L1 can be achieved by positioning the leading edge 129*b* of the signal contact pads 129 further from the front end 136*a* of the substrate 120 with respect to the leading edges 29*b* of the conventional substrate 20. Thus, the leading edge 129*b* of each of the signal contact pads 129 is spaced from the front end 136*a* of the substrate 120 a distance D7 along the longitudinal direction L that is greater than the distance D1 described above. In particular, the leading edges 129*b* are spaced from the front end 136*a* further than the leading edges 29*b* are spaced from the front end 36*a* by any distance as desired. For instance, the distance can be equal to the offset distance. In one example, the distance D7 can be approximately 0.2 mm greater than the distance D1. Alternatively, the distance can be less than the offset distance. Alternatively still, the distance can be greater than the offset distance. Thus, it should be appreciated that the distance D7 can be any suitable amount greater than the distance D1 as desired.

Similarly, because the leading edges 129*b* are rearwardly offset with respect to the leading edges 29*b*, the leading edges 129 are spaced from the rear end 36*b* of the substrate 120 a distance D8 along the longitudinal direction L that is less than the distance D2 described above. In particular, the leading edges 129*b* are spaced from the rear end 136*b* less than the leading edges 29*b* are spaced from the rear end 36*b* by any distance as desired. For instance, the distance can be equal to the offset distance. In one example, the distance D8 can be approximately 0.2 mm less than the distance D2. Alternatively, the distance can be less than the offset distance. Alternatively still, the distance can be greater than the offset distance. Thus, it should be appreciated that the distance D8 can be any suitable amount less than the distance D2 as desired.

Further, it should be appreciated that the trailing edges 129*a* can be spaced from the rear end 136*b* of the substrate 120 along the longitudinal direction L a distance equal to a distance that the trailing edges 129 are spaced from the rear end 36*b* of the conventional substrate 20. Alternatively, that the trailing edges 129*a* can be spaced from the rear end 136*b* of the substrate 120 along the longitudinal direction L a distance greater than the distance that the trailing edges 129 are spaced from the rear end 36*b* of the conventional substrate 20. Alternatively still, the trailing edges 129*a* can be spaced from the rear end 136*b* of the substrate 120 along the longitudinal direction L a distance less than the distance that the trailing edges 129 are spaced from the rear end 36*b* of the conventional substrate 20.

The lead-in contact pads 134 can define a lead-in contact pad length L4 as measured from the trailing edge 134*a* to the leading edge 134*b* along the longitudinal direction L. Because the signal contact length L3 of the substrate 120 is reduced with respect to the signal contact length L1 of the conventional substrate 20, the contact pad length L4 of the substrate 120 can be increased with respect to the contact pad length L2 of the conventional substrate 20 any suitable distance as desired. For instance, the distance can be equal to the offset distance. Thus, the distance can be approximately 0.2 mm. Alternatively, the distance can be greater than the offset distance. Alternatively still, the distance can be less than the offset distance.

The increased lead-in contact pad length L4 can be achieved by positioning the trailing edges 134*a* further from the front end 136*a* of the substrate 120 along the longitudinal direction L with respect to the trailing edges 34*a* of the conventional substrate 20. The trailing edges 134*a* can be positioned further from the front end 136*a* with respect to the trailing edges 34*a* by any distance as desired along the longitudinal direction L. For instance, the distance can be equal to the offset distance. Alternatively, the distance can be greater than the offset distance. Alternatively still, the distance can be less than the offset distance. The leading edges 134*b* can be spaced from the front end 136*a* of the substrate 120 approximately the same distance that the leading edges 34*b* are spaced from the front end 36*a* of the conventional substrate 20 along the longitudinal direction L. Alternatively, the leading edges 134*b* can be spaced from the front end 136*a* of the substrate 120 a distance different than the distance that the leading edges 34*b* are spaced from the front end 36*a* of the conventional substrate 20 along the longitudinal direction L.

As described above, the trailing edges 134*a* of the lead-in contact pads 134 and the leading edges 129*b* of the signal contact pads 129 are displaced in the rearward direction with respect to the trailing edges 34*a* and the leading edges 29*b*, respectively. Accordingly, the contact pad 34' is spaced from the leading edge 29*b* of the signal contacts the same distance as described above along the longitudinal direction L. For instance, the trailing edge 134*a* of each of the lead-in contact pads 134 can be spaced from the leading edges 129*b* of the aligned one of the signal contact pads 129 a distance D9 along the longitudinal direction L. That is, the gap that separates the lead-in contact pads 134 from the aligned ones of the signal contact pads 129 defines the distance D9 along the longitudinal direction L. The distance D9 can be approximately equal to the distance D3 of the conventional substrate 20.

Each of the signal contact pads 129 further defines a contact location 138 between the trailing edge 129*a* and the leading edge 129*b*. In particular, as the substrate 120 is received in the receptacle of the electrical connector 40, the mating portions 62 of the signal contacts 44 of the electrical connector can wipe along the lead-in contact pads 134 before being brought into physical and electrical contact with the signal contact pads 129 at the contact location 138. When the substrate 120 is fully mated with the electrical connector 40, the mating portions 62 are in physical contact with the signal contact pads 129 at the respective contact locations 138. The contact locations 138 can be aligned with each other along a respective plane that is defined by the lateral direction A and the transverse direction T.

The contact locations 138 are spaced a distance D10 from the front end 136*a* of the substrate 120 along the longitudinal direction L. The distance D10 can be approximately equal to the distance D4 that the contact locations 38 are spaced from the front end 36*a* of the conventional substrate 20 along the longitudinal direction L. Further, the contact location 138 is spaced a distance D11 from the rear end 136*b* of the substrate 120 along the longitudinal direction L. The distance D11 can be approximately equal to the distance D5 that the contact locations 38 are spaced from the rear end 36*b* of the conventional substrate 20 along the longitudinal direction L. Further, each of the contact locations 138 can be spaced from the leading edge 129*b* of the signal contact pads 129 along the longitudinal direction L a distance D12. The distance D12 can be less than the distance D6 that the contact locations 38 are spaced from the leading edge 29*b* of the conventional substrate 20. For example, the distance D12 can be less than the distance D6 by the offset distance. Thus, in one example, the contact locations 138 can be spaced from the leading edge 129 by a distance of approximately 1.55 mm along the longitudinal direction L. Alternatively, the distance D12 can be less than the distance D6 by greater than the offset distance. Alternatively, the distance D12 can be less than the distance D6 by less than the offset distance. It should be appreciated that the distance D12 can be within a range of 5-25% less than D6, such as approximately 10-15% less than D6, such as approximately 11.5% less than D6. The reduced distance D12 reduces the stub length of the signal contact pad 129. Without being bound by theory, it is believed that the reduced stub length improves the performance of the electrical connector 40 during operation as will now be described.

Figure 5A:
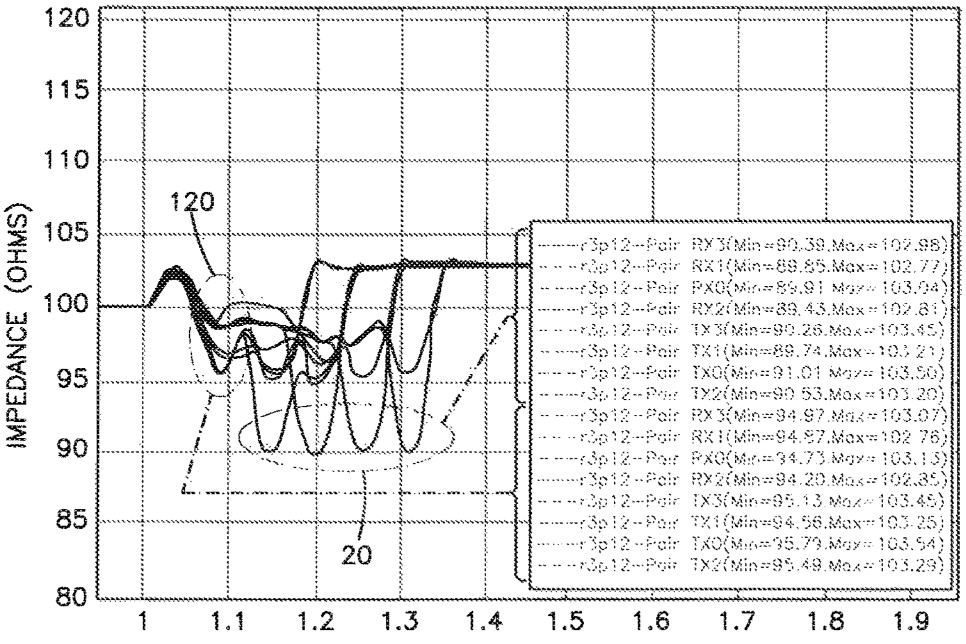
FIG. 5A is a graph that shows impedance as a function of time of several signal contact pairs of the paddle card illustrated in FIG. 3A.
Figure 5B:
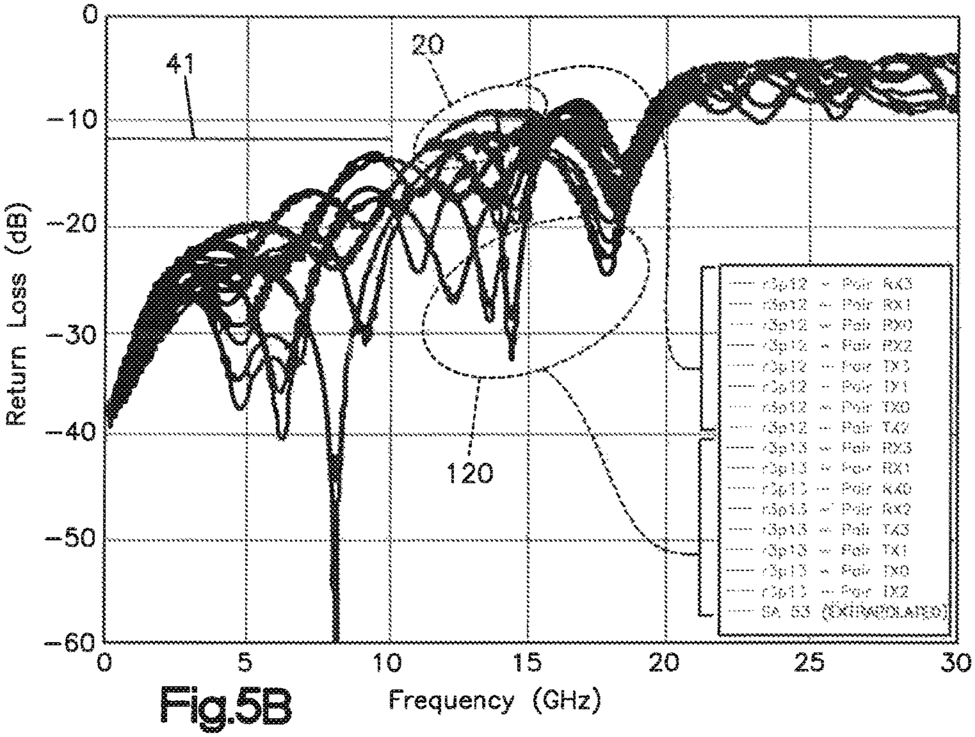
FIG. 5B is a chart that shows return loss as a function of operating frequency of several signal contact pairs of the paddle card illustrate in FIG. 3A.

It has been found that the performance of the electrical connector having the decreased signal contact length is improved compared to the conventional electrical connector that is otherwise identically constructed with the exception of the decreased signal contact length and the increased contact pad length. For instance, as illustrated in FIG. 5A, it is illustrated that the impedance of differential signal pairs of the substrate 120 is better matched than the impedance of differential pairs of the substrate 20. For instance, the impedance of the differential signal pairs of the substrate 120 is within five Ohms above or below 100 Ohms from 0 nanoseconds to 1.5 nanoseconds at a rise time of 30 picoseconds. Referring to FIG. 5B, it is recognized in the industry that a return loss threshold, such as approximately −10 dB, is used as a reference point in return loss to identity when an electrical connector is operating beyond its usable bandwidth (i.e., where the return loss crosses −10 dB). FIG. 5B identifies that the differential signal pairs of the substrate 120 can operate at approximately 6 GHz greater than the differential signal pairs of the substrate 20 without reaching the return loss threshold 41. As a result, the electrical connector whose at least one substrate is constructed as described above with respect to the substrate 120 can operate at approximately 12 Gigabits/Second greater than the conventional electrical connector whose at least one substrate is constructed as described above with respect to the substrate 20. For instance, the electrical connector whose at least one substrate is constructed as described above with respect to the substrate 120 can operate at 24 Gigabits/second. While the electrical connector whose at least one substrate is constructed as described above with respect to the substrate 120 can experience return loss suck-out at approximately 8 GHz, it is recognized that the electrical connector will operate at frequencies about 8 GHz.

It should be appreciated that methods for designing and constructing the substrate 120 having the structure and dimensions described above are contemplated within the scope of the present disclosure. It should be further appreciated that methods for designing and constructing a connector that includes at least one of the substrate 120, having the structure and dimensions described above, are contemplated within the scope of the present disclosure.

Further, it should be appreciated that a method mating at least one or both of the substrates 120*a* and 120*b* with the electrical connector 40 is provided. For instance, the method can include the step of inserting the front end 136*a* of the at least one or both of the substrates 120*a* and 120*b* into the receptacle of the electrical connector 40 in the insertion direction. For instance, the step of inserting can include the step of inserting the first substrate 120*a* into the upper receptacle 45*a*, and inserting the second substrate 120*b* into the lower receptacle 45*b*. The method can further include the step of bringing the mating ends 62 of the plurality of electrical contacts 44 of the electrical connector 40 into contact with respective ones of the plurality of electrical signal contact pads 129. For instance, the step of bringing can include bringing the mating ends 62 of the plurality of electrical contacts 44 of the electrical connector 40 into contact with respective ones of the plurality of electrical signal contact pads 129 at the respective contact locations 138. Interference between the connector housing and the at least one of the first and second substrates 120*a* and 120*b* can prevent the at least one of the first and second substrates 120*a* and 120*b* from being further inserted into the corresponding at least one receptacle of the connector housing 42 along the insertion direction when the at least one of the first and second substrates 120*a* and 120*b* is fully mated to the electrical connector 40. The method can further include the step of wiping the mating ends 162 along the lead-in contact pads 134 prior to bringing the mating ends 162 into contact with the respective ones of the plurality of electrical signal contact pads 129.

The foregoing description is provided for the purpose of explanation and is not to be construed as limiting the invention. While various embodiments have been described with reference to preferred embodiments or preferred methods, it is understood that the words which have been used herein are words of description and illustration, rather than words of limitation. Furthermore, although the embodiments have been described herein with reference to particular structure, methods, and embodiments, the invention is not intended to be limited to the particulars disclosed herein. For instance, it should be appreciated that structure and methods described in association with one embodiment are equally applicable to all other embodiments described herein unless otherwise indicated. Those skilled in the relevant art, having the benefit of the teachings of this specification, may effect numerous modifications to the invention as described herein, and changes may be made without departing from the spirit and scope of the invention, for instance as set forth by the appended claims.

The invention claimed is:

1. A substrate configured to be received by an electrical connector, the substrate comprising:

a trailing end and a leading end spaced from the trailing end in a direction of insertion of the substrate into the electrical connector;

at least one surface;

at least one electrical signal contact pad carried by the at least one surface and defining a trailing edge and a leading edge spaced from the trailing edge in the direction of insertion, the electrical signal contact pad having a signal contact pad length from the leading edge to the trailing edge that is less than another signal contact pad length of a signal contact pad of another substrate that is configured to be received by the electrical connector by an offset distance of approximately 0.2 mm; and a lead-in contact pad disposed between the at least one electrical signal contact pad and the leading end, wherein the lead-in contact pad has a contact pad length greater than a lead-in contact pad length of the another substrate.

2. The substrate as recited in claim 1, wherein the signal contact pad length is approximately 1.65 mm.

3. The substrate as recited in claim 1, wherein the at least one electrically conductive signal contact pad comprises a plurality of electrically conductive pads arranged in pairs, and the substrate further comprises a ground contact pad disposed between the pairs.

4. The substrate as recited in claim 1, further comprising an electrical lead-in contact pad disposed between the at least one electrical signal contact pad and the leading end, wherein the lead-in contact pad has a contact pad length greater than a lead-in contact pad length of the another substrate.

5. The substrate as recited in claim 4, wherein the lead-in contact pad length of the substrate is greater than the lead-in contact pad length of the another substrate by the offset distance.

6. The substrate as recited in claim 4, wherein a trailing edge of the at least one lead-in contact pad is spaced from the leading end of the substrate a distance that is greater than a distance by which a trailing edge of a lead-in contact pad of the another substrate is spaced from a leading end of the another substrate.

7. The substrate as recited in claim 4, wherein the lead-in contact pad is spaced from the leading edge of the select signal contact a distance that is equal to a distance at which the contact pad of the otherwise substantially identical substrate is spaced from the leading edge of the signal contact of the another substrate.

8. The substrate as recited in claim 7, wherein the at least one electrically conductive signal contact pad comprises a plurality of electrically conductive pads arranged in pairs, and the substrate further comprises:

a ground contact pad disposed between the pairs; and a plurality of lead-in contact pads, each aligned with a respective one of the electrical signal contact pads along the direction of insertion.

9. The substrate as recited in claim 1, wherein the leading edge of the at least one electrical signal contact pad is spaced from the leading end of the substrate approximately 2 mm greater than the distance that a leading edge of the signal contact of the otherwise substantially identical substrate is spaced from the leading end of the otherwise substantially identical substrate.

10. The substrate as recited in claim 1, wherein the at least one electrical signal contact pad defines a contact location that is configured to contact a mounting portion of a signal contact of the electrical connector when the substrate is fully mated to the electrical connector, and the contact location is spaced from a leading edge of the electrical signal contact pad by a distance of approximately 1.65 mm.

11. The substrate as recited in claim 1, wherein the at least one electrical signal contact pad defines a contact location that is configured to contact a mounting portion of a signal contact of the electrical connector when the substrate is fully mated to the electrical connector, and the contact location is spaced from a leading edge of the electrical signal contact pad by a distance that is less than a corresponding distance by which a contact location of the another substrate is spaced from a leading end of the another signal contact pad.

12. The substrate as recited in claim 11, wherein the contact location of the at least one electrical signal contact pad is spaced from the leading end of the substrate a distance that is equal to a distance at which the contact location of the otherwise substantially identical substrate is spaced from the leading end of the otherwise substantially identical substrate.

13. The substrate as recited in claim 1, configured substantially identical to the another substrate, with the exception of the lead-in contact pad length and the signal contact pad length.

14. The substrate as recited in claim 13, wherein the at least one surface comprises first and second surfaces each carrying the plurality of electrically conductive signal contact pads, the ground contact pads, and the lead-in contact pads.

15. An electrical connector comprising a connector housing and a plurality of electrical contacts supported by the connector housing, the electrical contacts having mating ends that extend into at least one receptacle of the connector housing, and the at least one receptacle is configured to receive at least one of the substrate as recited in claim 2, so as to mate the electrical contacts to the substrate.

16. The electrical connector as recited in claim 15, configured as a SAS connector, a mini-SAS connector, or a mini-SAS HD connector.

17. The electrical connector as described in claim 16, wherein:

the at least one signal contact pad of the substrate comprises a plurality of pairs of signal contact pads configured to mate with a respective plurality of pairs of the electrical contacts of the connector; and the plurality of pairs of the electrical contacts and the plurality of pairs of signal contact pads on the substrate are configured to operate with one another at least above 13 GHz without crossing a return loss threshold of −10 dB.

18. The substrate as described in claim 1, wherein the another substrate is fully compliant with a mini-SAS HD specification.

19. A method of mating a substrate to an electrical connector, the substrate comprising:

a trailing end and a leading end spaced from the trailing end in a direction of insertion of the substrate into the electrical connector;

at least one surface; and at least one electrical signal contact pad carried by the at least one surface and defining a trailing edge and a leading edge spaced from the trailing edge in the direction of insertion, the electrical signal contact pad having a signal contact pad length from the leading edge to the trailing edge that is less than another signal contact pad length of a signal contact pad of another substrate that is configured to be received by the electrical connector by an offset distance, wherein the at least one electrically conductive signal contact pad comprises a plurality of electrically conductive pads arranged in pairs, and the substrate further comprises a ground contact pad disposed between the pairs, the connector comprising:

a connector housing and a plurality of electrical contacts supported by the connector housing, the electrical contacts having mating ends that extend into at least one receptacle of the connector housing, and the at least one receptacle is configured to receive at least one mating substrate comprising, the mating substrate comprising:

a trailing end and a leading end spaced from the trailing end in a direction of insertion of the mating substrate into the electrical connector;

at least one surface;

at least one electrical signal contact pad carried by the at least one surface and defining a trailing edge and a leading edge spaced from the trailing edge in the direction of insertion, the electrical signal contact pad having a signal contact pad length from the leading edge to the trailing edge that is less than another signal contact pad length of a signal contact pad of another substrate that is configured to be received by the electrical connector by an offset distance, the signal contact pad length is approximately 1.65 mm such that the signal contact pad length of the at least one electrical signal contact pad is less than the another signal contact pad length by between approximately 5% and approximately 25%; and a lead-in contact pad disposed between the at least one electrical signal contact pad and the leading end, wherein the lead-in contact pad has a contact pad length greater than a lead-in contact pad length of the another substrate, and the method comprising:

inserting the leading end of the substrate into the receptacle of the electrical connector in the insertion direction;

wiping the mating ends along the lead-in contact pads prior to bringing the mating ends into contact with the respective ones of the plurality of electrical signal contact pads; and bringing the mating ends of the plurality of electrical contacts of the electrical connector into contact with respective ones of the plurality of electrical signal contact pads.

20. The method as recited in claim 19, further comprising wiping the mating ends along the lead-in contact pads prior to bringing the mating ends into contact with the respective ones of the plurality of electrical signal contact pads.

21. The method as described in claim 19, further comprising operating a plurality of signal pairs of the plurality of electrical contacts of the connector in contact with a respective plurality of pairs of electrical signal contact pads of the substrate at least above 13 GHz without crossing a return loss threshold of −10 dB.

22. The method as described in claim 19, wherein the another substrate is fully compliant with a mini-SAS HD specification.

23. An electrical connector comprising:

a substrate comprising a surface comprising an edge;

a plurality of electrical signal contact pads carried by the surface in a row extending parallel to the edge, wherein the positions of the plurality of electrical signal contact pads are compatible with a mini-SAS HD standard, each of the electrical signal contact pads is elongated in a direction perpendicular to the edge, and each of the electrical signal contact pads has a length of less than 1.75 mm; and a plurality of lead-in contact pads disposed between the plurality of electrical signal contact pads and the edge, wherein the lead-in contact pads are aligned with respective electrical signal contact pads of the plurality of electrical signal contact pads, and the lead-in contact pads have a contact pad length greater than 0.9 mm, whereby the connector is compatible with the mini-SAS HD standard, but the signal pads are shorter than specified in the mini-SAS HD standard and the lead-in pads are longer than specified in the mini-SAS HD standard.

24. The electrical connector as described in claim 23, wherein:

each of the electrical signal contact pads has a length of 1.65 mm or less, and each of the lead-in contact pads has a length of 1.00 mm or greater, and a gap distance between the plurality of lead-in contact pads and the edges of the signal contact pads is equal to a gap distance specified in the mini-SAS HD standard.

* * * * *